United States Patent
Batchelor et al.

(10) Patent No.: US 7,342,460 B2
(45) Date of Patent: Mar. 11, 2008

(54) EXPANDED PULL RANGE FOR A VOLTAGE CONTROLLED CLOCK SYNTHESIZER

(75) Inventors: Jeffrey S. Batchelor, Austin, TX (US); Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 88 days.

(21) Appl. No.: 11/278,326

(22) Filed: Mar. 31, 2006

(65) Prior Publication Data
US 2007/0176691 A1 Aug. 2, 2007

Related U.S. Application Data

(60) Provisional application No. 60/763,503, filed on Jan. 30, 2006.

(51) Int. Cl.
*H03L 7/18* (2006.01)
(52) U.S. Cl. ............... 331/16; 331/10; 331/17; 331/66; 331/158; 331/175; 331/179
(58) Field of Classification Search ........... 331/1 A, 331/10, 11, 16–18, 25, 66, 107 A, 116 R, 331/116 FE, 158, 159, 175, 179
See application file for complete search history.

(56) References Cited

U.S. PATENT DOCUMENTS

| | | | |
|---|---|---|---|
| 3,882,412 A * | 5/1975 | Apple, Jr. ............... 331/1 A |
| 4,179,670 A | 12/1979 | Kingsbury | |
| 5,012,244 A | 4/1991 | Wellard et al. | |
| 5,036,294 A | 7/1991 | McCaslin | |
| 5,036,300 A | 7/1991 | Nicolai | |
| 5,200,750 A | 4/1993 | Fushiki et al. | |
| 5,451,912 A | 9/1995 | Torode | |
| 5,485,127 A | 1/1996 | Bertoluzzi et al. | |
| 5,754,072 A | 5/1998 | Mazzetti | |
| 5,781,054 A | 7/1998 | Lee | |
| 5,877,656 A | 3/1999 | Mann et al. | |
| 5,970,110 A | 10/1999 | Li | |

(Continued)

OTHER PUBLICATIONS

U.S. Appl. No. 10/180,833, filed Jun. 25, 2002, "Feedback System Incorporating Slow Digital Switching for Glitch-Free State Changes,", Rex Baird, Yunteng Huang and Michael H. Perrott, inventors.

(Continued)

*Primary Examiner*—David Mis
(74) *Attorney, Agent, or Firm*—Zagorin O'Brien Graham LLP

(57) ABSTRACT

A technique provides a clock source that meets accuracy requirements, allows the use of a low cost resonator, provides a wide range of output frequencies, and provides suitable phase noise performance. The technique generates a clock signal having a target output frequency using a controllable oscillator having at least one continuous frequency range of operation. The technique dynamically adjusts a reference control value based on a voltage for adjusting a frequency of the clock signal around a frequency determined by the reference control value. The reference control value is adjusted to be approximately within the center of an actual pull range corresponding to the controllable oscillator and a voltage control input of the controllable oscillator. The effective pull range of the controllable oscillator is continuous across the at least one continuous frequency range of operation.

27 Claims, 10 Drawing Sheets

U.S. PATENT DOCUMENTS

| | | |
|---|---|---|
| 6,008,703 A | 12/1999 | Perrott et al. |
| 6,091,943 A | 7/2000 | Nyenhuis |
| 6,137,372 A | 10/2000 | Welland |
| 6,147,567 A | 11/2000 | Welland et al. |
| 6,154,095 A | 11/2000 | Shigemori et al. |
| 6,201,448 B1 | 3/2001 | Tam et al. |
| 6,344,814 B1 | 2/2002 | Lin et al. |
| 6,385,443 B1 | 5/2002 | Lee et al. |
| 6,400,298 B1 | 6/2002 | Lee |
| 6,515,540 B1 | 2/2003 | Prasad et al. |
| 6,515,553 B1 | 2/2003 | Filiol et al. |
| RE38,083 E | 4/2003 | Ashe |
| 6,556,159 B1 | 4/2003 | Fei et al. |
| 6,556,966 B1 | 4/2003 | Gao |
| 6,566,966 B1 | 5/2003 | Bellaouar et al. |
| 6,580,376 B2 | 6/2003 | Perrott |
| 6,590,426 B2 | 7/2003 | Perrott |
| 6,646,581 B1 | 11/2003 | Huang |
| 6,670,854 B2 | 12/2003 | Takeda et al. |
| 6,750,839 B1 | 6/2004 | Hogan |
| 6,753,738 B1 | 6/2004 | Baird |
| 6,825,785 B1 | 11/2004 | Huang et al. |
| 6,850,554 B1 | 2/2005 | Sha et al. |
| 2002/0008593 A1 | 1/2002 | Gomez et al. |
| 2002/0135428 A1 | 9/2002 | Gomez |
| 2003/0016088 A1 | 1/2003 | Scheffler |
| 2004/0232995 A1 | 11/2004 | Thomsen et al. |
| 2006/0119402 A1 | 6/2006 | Thomsen et al. |
| 2006/0119437 A1 | 6/2006 | Thomsen et al. |

OTHER PUBLICATIONS

Maxin "Low-jitter 155MHz/622MHz Clock Generator," Max3670 Data Sheet, Rev. 1, May 2003, 13 pages.

Razavi, Behzad, "Design of Monolithic Phase-Locked Loops and Clock Recovery Circuits--A Tutorial," Preface, *Monolithic Phase-Locked Loops and Clock Recovery Circuits Theory and Design*, IEEE Press, New York, 1996, pp. 1-39.

\* cited by examiner

EXPANDED PULL RANGE FOR A VOLTAGE CONTROLLED CLOCK SYNTHESIZER

CROSS-REFERENCE TO RELATED APPLICATIONS

This application claims the benefit under 35 U.S.C. § 119(e) of U.S. Provisional Application No. 60/763,503, filed Jan. 30, 2006, entitled "Expanded Pull Range for a Voltage Controlled Clock Synthesizer" by Jeffrey S. Batchelor and Axel Thomsen, which application is hereby incorporated by reference.

BACKGROUND

1. Field of the Invention

This application relates to integrated circuit devices more particularly to integrated circuits utilized in generating clock signals and systems incorporating such circuits.

2. Description of the Related Art

Clock sources typically utilize a resonator such as a crystal oscillator or surface acoustic wave (SAW) device. Precision in traditional clock sources utilizing crystal oscillators is determined by the accuracy of the cut of the crystal and the calibration performed after the cut. For example, frequency tuning may be achieved by sputtering gold onto the crystal after cutting the crystal. Fixed frequency sources such as crystals have typically provided better phase noise performance than the phase noise performance associated with variable frequency source such as, e.g., a voltage controlled oscillator (VCO). That is due, at least in part, to the fact that the variable elements (e.g., the varactor) associated with the VCO used to vary the frequency typically have higher losses than fixed elements such as the capacitors in a fixed source.

However, resonators typically have a limited optimum range due to manufacturing constraints, i.e., in general, it is difficult to pull an oscillating frequency of a crystal to a target frequency from a wide range of frequencies. However, various applications have requirements for numerous frequencies outside of the pull range of a resonator. Typically, a different frequency range will require a different resonator. Accuracy requirements vary for clock sources, but are typically in the parts per million (ppm) range.

The drive to design network equipment with multi-service capable interfaces has dramatically increased the complexity of the timing subsystems. In addition to standard Synchronous Optical Network/Synchronous Digital Hierarchy (SONET/SDH) rates, these new systems must now support a diverse set of line rates including 10 Gbps Ethernet, 10 Gbps Fibre Channel, as well as the associated forward error correction (FEC) rates. Requirements to support these new data rates is forcing timing subsystem designers to develop timing sources capable of providing an expanded set of low jitter, high frequency (frequencies of 622 MHz or greater) reference clocks for use across the data processing chain from physical layer to backplane transceiver. A summary of common line rates and the associated board level reference clock frequencies is provided in Table 1. Since these frequencies are not related by a simple integer ratio, designers must rely on multiple discrete oscillators or sophisticated phase-locked loops (PLLs) to support the various reference clock generation requirements in multi-protocol systems. Note that many of the line rates are around 10 Gbits per second.

TABLE 1

| Protocol | Data Rate (Gbps) | Forward Error Correction (FEC) Ratio | Line Rate (Gbps) | Required Oscillator Frequencies (MHz) |
|---|---|---|---|---|
| SONET OC-192, SDH STM-64 | 9.95 | — | 9.95 | 622.08, 155.52 |
| G.975 (4 × OC-48 + FEC) | 9.95 | 255/238 | 10.66 | 666.51, 166.63 |
| OTN OTU2 (G.709) | 9.95 | 255/237 | 10.71 | 669.33, 167.33 |
| 10 Gbps Ethernet LAN | 10.31 | — | 10.31 | 644.53, 161.13 |
|  | 10.31 | 255/238 | 11.04 | 690.57, 172.64 |
|  | 10.31 | 255/237 | 11.10 | 693.48, 173.37 |
| 10 Gbps Fibre Channel | 10.52 | — | 10.52 | 657.42, 164.35 |
|  | 10.52 | 255/237 | 11.32 | 707.35, 176.83 |

Using conventional oscillator technology, the system timing architectures of multi-service systems become unwieldy as the number of oscillators grows to support an expanded set of line rates.

Clock scaling PLLs are critical timing subsystems because they perform the clock scaling required to synchronize the data transmission rates between the client side and the line side. The design of these PLLs is difficult because they must provide non-integer clock scaling, operate at high frequencies (>600 MHz), provide low jitter (<0.3 ps RMS), and cover a range of frequencies that span approximately 100 MHz. To meet the jitter requirements, discrete voltage controlled SAW oscillators (VCSOs) or high frequency fundamental (HFF) voltage controlled oscillators (VCXOs) must be used in the PLL circuit. Since these devices are only capable of operating within a few hundred parts per million (ppm) of a center frequency, multi-protocol support requires a bank of VCSOs or VCXOs to support the range of input to output frequency translations required. In addition, special care must be taken during the design and layout of the PLL circuit to accommodate variations in VCSO electrical performance like voltage gain (Kv) and prevent noise coupling between VCSOs and other board level components.

These crystal and SAW based oscillators introduce various reliability issues including temperature drift and long term aging. If the temperature drift or aging causes the frequency to drift beyond the pull range of the oscillator, the timing subsystem may need replacement. Thus, it would be desirable to be able to expand the pull range of these oscillators to account for aging and temperature effects in timing subsystems.

SUMMARY

A technique provides a clock source that meets accuracy requirements, allows the use of a low cost resonator, provides a wide range of output frequencies, and provides suitable phase noise performance. The technique generates a clock signal having a target output frequency using a controllable oscillator having at least one continuous frequency range of operation. The technique dynamically adjusts a reference control value based on a voltage for adjusting a frequency of the clock signal around a frequency determined by the reference control value. The reference control value is adjusted to be approximately within the center of an actual pull range corresponding to the controllable oscillator and a voltage control input of the controllable oscillator. The effective pull range of the controllable oscillator is continuous across the at least one continuous frequency range of operation.

In at least one embodiment of the invention, an apparatus includes a controllable oscillator circuit configured to provide an oscillator output signal. A frequency of the oscillator output signal is based at least in part on a first digital control signal and a timing reference signal. The apparatus includes a voltage control input configured to adjust the frequency of the oscillator output signal around a frequency determined by a reference control value. The first digital control signal is based on at least a control voltage present on the voltage control input and the reference control value. The reference control value is based on at least a stored control value and one or more control voltages present on the voltage control input.

In at least one embodiment of the invention, a method includes supplying a digital control signal to a controllable oscillator thereby determining a frequency of an oscillator output signal. The method includes determining the digital control signal based on at least a reference control value and a control voltage for adjusting the frequency of the oscillator output signal around a frequency determined by the reference control value. The method includes adjusting the reference control value based on at least one value of the control voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
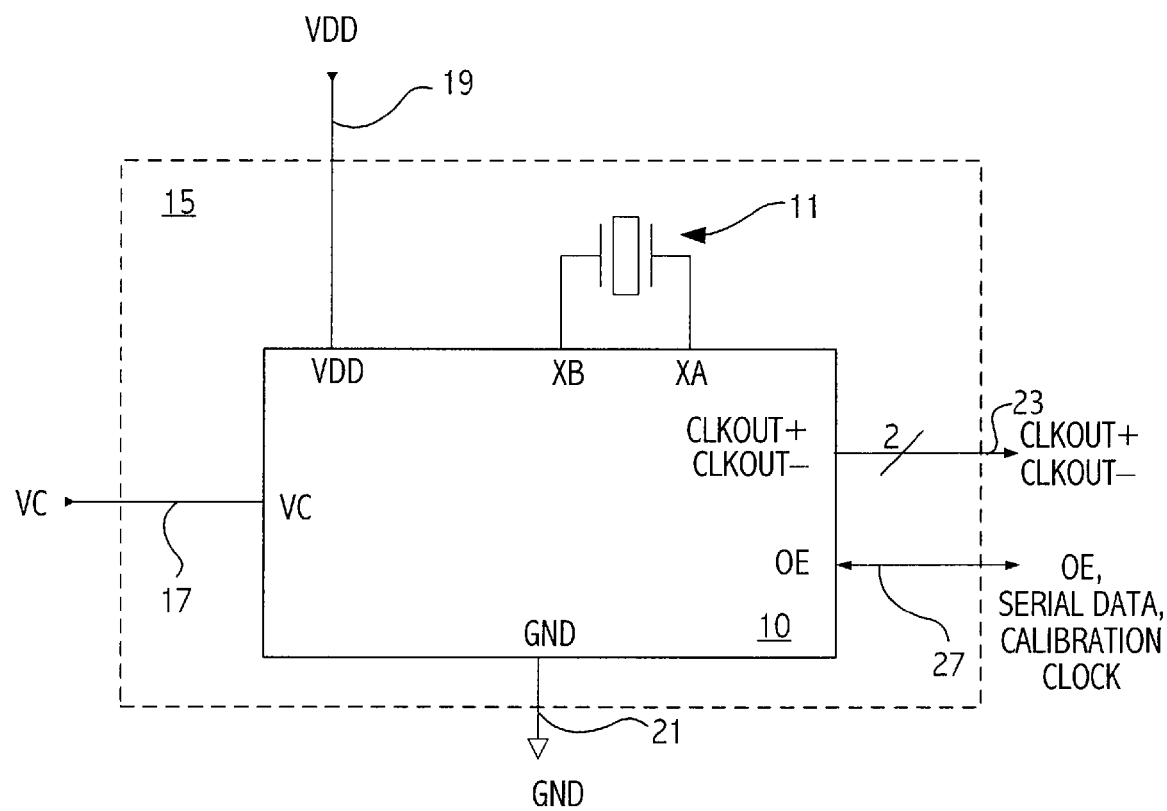
FIG. 1 illustrates a device in which an integrated circuit and a crystal are packaged in a standard six pin VCXO ceramic package.

Referring to FIG. 1, a high level diagram shows a clock source device that includes an integrated circuit 10 coupled to a crystal 11. In one embodiment of the clock source device, both the integrated circuit 10 and the crystal 11 are packaged in a standard ceramic package 15 that is typically utilized for packaging a voltage controlled crystal oscillator (VCXO). Note that another resonating device, such as a surface acoustic wave (SAW) resonator, may be utilized in place of crystal 11. In the illustrated embodiment, the package 15 includes standard input/output signals including a voltage control input 17, a power and ground input, 19 and 21 respectively, differential clock outputs 23, and an output enable (OE) pin 27. In at least one embodiment of the invention, a four pin package implementation does not utilize control voltage input 17 and includes a single-ended output clock. A six pin package configuration may also be utilized in which the control voltage input on the package is not connected when package 15 is mounted to a board. Other packaging alternatives for the integrated circuit, with or without the crystal oscillator or SAW, may also be utilized.

Figure 2:
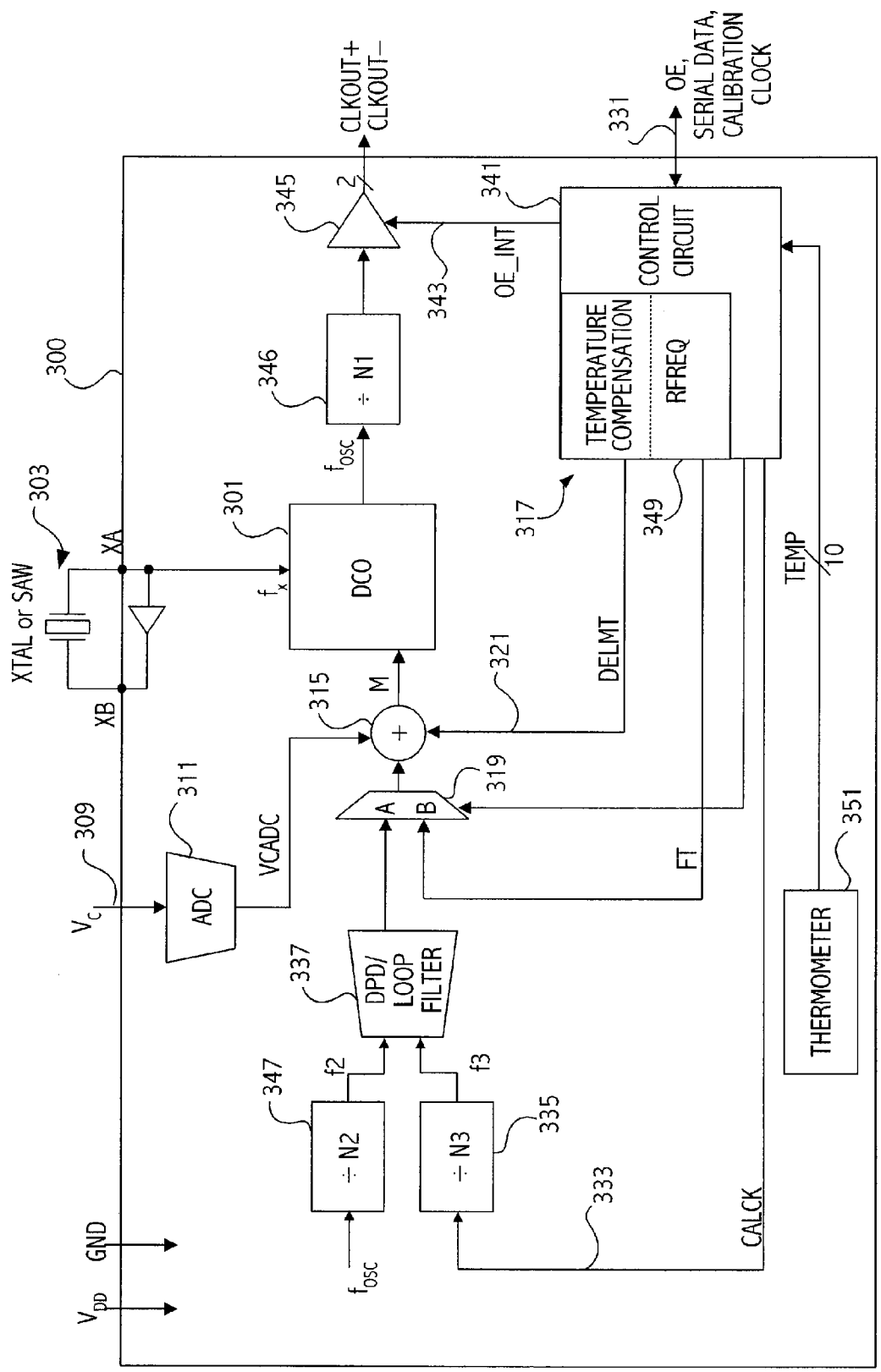
FIG. 2 illustrates a block diagram of an exemplary integrated circuit suitable for use as the integrated circuit in FIG. 1.

Referring to FIG. 2, a block diagram illustrates an embodiment of integrated circuit 10 that provides a fixed frequency or voltage controlled clock source. In FIG. 2, the integrated circuit is packaged in a six pin VCXO package. Integrated circuit 300 includes a digitally controlled oscillator (DCO) 301. With the use of a fractional N phase-locked loop (PLL), a crystal based reference clock 303 can be multiplied up by a rational number to supply a wide variety of output frequencies. The fractional N loop can be viewed as a digitally controlled oscillator, where the output frequency is controlled by the rational digital number M according to Fout=M×Fref. Thus, the DCO 301 can be implemented as a fractional N PLL providing a wide range of output frequencies $f_{osc}=M \times f_x$, where $f_x$ is supplied from oscillator 303. The precision of M can be to the level of a few parts per billion. An important criteria is to ensure that a DCO, such as illustrated in FIG. 2, meets the phase noise specifications typically achieved by a fixed frequency crystal or SAW based oscillator. A standard of interest would be for example the SONET standard for jitter generation.

Fractional N phase-locked loops (PLLs) allow the multiplication of an incoming reference clock by a rational number rather than an integer number as is common in traditional PLL designs. Such a multiplication requires the use of a multi-modulus divider in the feedback path. Such a divider will divide not by a fixed integer, but by a sequence of integers that over time approximates the rational number desired. This sequence can be generated by a digital delta sigma modulator which shapes the quantization noise added to the rational number with a high pass filter. Thus, the resulting phase noise is also shaped by a high pass filter. The overall noise contribution from the fractional PLL depends on several factors. One factor is the update rate of the PLL (generally the reference clock rate from, e.g., XO 303) in relation to the loop bandwidth of the PLL, a measure similar to the oversampling ratio (OSR) in delta sigma analog-todigital converters (ADCs). A higher OSR allows for better suppression of quantization noise in the band of interest. For a given update rate the noise contribution can be reduced by lowering the loop bandwidth. Another factor contributing to noise is the quantization error applied at the divider.

Good jitter performance of the DCO loop is facilitated by implementation of the loop filter as a digital filter, which is a technique that allows an accurate implementation of the loop filter that is properly matched to the corners and the order of the noise shaping function and therefore can best reduce the jitter contribution from that source. Digital loop filter implementations are known in the art and described, e.g., in U.S. Pat. No. 6,630,868, entitled "Digitally Synthesized Loop Filter Circuit Particularly Useful for a Phase Locked Loop," naming Perrott et al. as inventors, which is incorporated herein by reference.

Additionally, the current phase error can be computed as the integral of all instantaneous frequency errors as they were computed in the delta sigma modulator that controls the multi modulus divider. Through subtraction in the analog or digital domain, the phase error can be cancelled and thus strongly reduced as a noise source. As a result the bandwidth can be increased and thus overall better jitter performance can be achieved.

The device illustrated in FIG. 2 can function as a voltage-controlled crystal oscillator (VCXO/VCSO) or as a fixed-frequency clock source (XO/SO). A register bit setting may be used to select between the modes of operation. In voltage-controlled oscillator operational mode a control voltage is received on the $V_C$ analog voltage input port 309. The on-chip analog-to-digital converter (ADC) 311 converts the control voltage $V_C$ into a digital control word (VCADC) supplied to summing circuit 315, which generates the control signal M for the DCO 301. When operating in VCXO/VCSO mode, the selector circuit 319 selects input B, which is coupled to the reference frequency (RFREQ) control value stored in a portion 349 of non-volatile storage 317. The control value from the selector circuit may be summed in summing circuit 315 with a temperature compensation value (DELMT) supplied on node 321 as described further herein, as well as with the control VCADC, and the sum is supplied to DCO 301 as the control signal to determine the DCO output. In VCXO/VCSO mode the RFREQ provides a center frequency that is adjusted by VCADC. If temperature compensation is not used, a value for DELMT is selected so as to not affect the output of DCO 301. Note that while 315 is shown in the block diagram as a summing circuit, some embodiments may utilize other arithmetic circuits to appropriately combine the various control values that are used to form the control signal M for DCO 301. For example in one embodiment, the signals are combined using a multiplier circuit in which the center frequency provided by RFREQ is scaled appropriately by VCADC and/or DELMT using a multiplier circuit.

The use of a DCO as a clock source has several advantages. Digital control of the output frequency allows for storage of calibration parameters in non-volatile memory 317. Also, the DCO can be embedded in an outer phase locked loop as described further herein. This outer loop includes a phase detector with digital output and a digital loop filter 337 and the DCO 301. When the outer loop is in lock to a reference frequency, the value present at the input to the DCO 301 is the proper multiplier to achieve this frequency in an open loop operation. Therefore this value can be stored while in lock and recalled later for operation in open loop as a clock source. The loop bandwidth of the inner loop, as described above, is preferably greater than the 1/f corner. Depending on specific implementations, the loop bandwidth of the inner loop may range from approximately 10 KHz to approximately 10 MHz. The loop bandwidth of the outer loop is preferably substantially lower, e.g., below approximately 1 KHz and may be less than or equal to 50 Hz. Note also that the inner loop is implemented to adjust quickly to changes as compared with the outer loop. Having a low outer loop bandwidth allows attenuation of jitter present on the reference clock input to the outer loop, which in turn can reduce jitter present in a stored control value to control the output of the inner loop.

The embodiment illustrated in FIG. 2 has the capability of generating and storing a digital control value for DCO 301 corresponding to a calibration clock signal received via a calibration input. As discussed, above, when the outer loop is in lock to a reference frequency used for calibration, the value present at the input to DCO 301 is the proper multiplier to achieve this frequency in an open loop operation. Therefore this value can be stored while in lock and recalled later for operation in open loop as a clock source. In that way, the device can be programmed to provide a clock having a target output frequency. When operating in calibration mode, a calibration clock signal is supplied, e.g., on terminal 331 and via signal line 333 to divider 335. The calibration clock is compared to the output of DCO 301 in phase and frequency detector 337 and an error signal is generated and filtered and supplied to adjust the output of DCO 301. When the output of the DCO has locked to the supplied calibration clock, the value of M may be stored. The calibration clock feature is useful, e.g., so that the device can lock its output clock to the calibration clock using an internal PLL, and control factors used to lock the PLL to the calibration clock can be stored for absolute output frequency and/or frequency versus temperature, as described further below. That stored value may then be utilized to control the DCO during normal operation.

In order to supply the calibration clock and perform necessary programming associated with configuring the clock source, a communication port, e.g., a serial port may be provided. The serial port may be provided as a dedicated programming port or its function can be combined with other I/O terminals. For example, in one embodiment, OE pin 331 functions as a normal output enable and for programming and calibrating the device 300. In order to program the integrated circuit device, OE terminal 331 is used to communicate serial data to and from the integrated circuit 300 and used to supply a calibration clock. FIG. 2 shows an embodiment where the OE pin is also used as the communications port. In still other embodiments, the voltage control input 309 may be used as a serial communications port. In order to distinguish between calibration clocks and serial data, a serial data command may be utilized that indicates to the device that the calibration clock will be applied next. That command enables the calibration PLL. After this command, the user supplies a calibration clock to the appropriate terminal providing the serial port. The frequency of the calibration clock may be low even though the output frequencies are high due to the use of the divider 347 in the feedback path from the oscillator 301.

The serial port is typically used during manufacture test to establish the desired device configuration in the on-chip non-volatile memory (NVM) 317. Serial port communications can begin following a power-on-reset of the device. However, in at least one embodiment, a dedicated I/O on the integrated circuit device may be used. Techniques for programming and calibrating integrated circuit 300 are described in U.S. patent application Ser. No. 10/675,543, entitled "Calibration of Oscillator Devices," filed Sep. 30, 2003 and U.S. patent application Ser. No. 11/270,957, entitled "Voltage Controlled Clock Synthesizer," filed Nov. 10, 2005, which applications are incorporated herein by reference.

Digitally-controlled oscillator (DCO) 301 is driven by a digital frequency control word M and produces a low jitter output clock. The control word M supplied to the DCO 301 is generated by summing (or multiplying as mentioned above) a reference frequency control word (RFREQ) with the VCO ADC 311 output (VCADC), if utilized, and the temperature compensation value (DELMT), if utilized, in summer 315. The fixed frequency external crystal 303, SAW, or other source, provides a low jitter reference needed to synthesize the output clock. In at least one embodiment of integrated circuit 300, frequency synthesis is performed digitally, eliminating sensitive noise entry points.

Note that the serial communication capability available through input/output terminal 331 also allows a user to program a fixed control value to set DCO 301 to a specific output frequency by writing to reference frequency storage location 349, supplying that value to multiplexer 319 and selecting the B input of multiplexer 319 to be supplied to summing circuit 315. Additionally, in some embodiments, the divider ratios in some or all of divider blocks may be written and/or read via the serial port provided by an input/output terminal.

Note that calibration can also be performed without a calibration clock input. However, that requires multiple serial data writes to the device to set the digital control value supplied, e.g., through summing circuit 315, so that while the control voltage $V_C$ is centered, the clock out signal matches the desired output clock frequency. By instead using a calibration clock supplied over the serial port, the device can itself find the desired correction value by locking its PLL to the calibration clock.

On-chip nonvolatile memory (NVM) 317 provides for permanent storage of device configuration settings and calibration settings at manufacture. The NVM memory space includes bits for all of the settings necessary to fully configure the device. The volatile memory space includes duplicate bits for each NVM bit, plus additional bits that do not require nonvolatile storage. In one embodiment, the non-volatile memory is one time programmable. Other embodiments may provide more flexibility. Upon power up, the device internally executes a power on-reset (POR) which resets the internal device logic, loads the various settings stored in the non-volatile memory into volatile memory (e.g., the various control registers), and places the device output into high impedance. A register bit may also be used to initiate a reset.

In one embodiment of integrated circuit 300, the center frequency of the device is determined by the reference frequency (RFREQ) supplied to the DCO as control input M and the HS_DIV (see FIG. 3) and N1 output divider values. Note that while one or more pins may be used to select the output frequency according to their logical value, i.e., the output frequency is pin programmable, in other embodiments a digital communications interface such as I²C™ or serial peripheral interface (SPI) may be used to select the output frequency by writing appropriate control information to control registers in control circuit 341. That provides additional flexibility but requires intelligence to reside on the board to control the digital interface.

Note that the device illustrated in FIG. 2 can provide temperature compensation. That compensation is achieved by supplying the appropriate compensation value from non-volatile memory 317 based on the temperature detected by thermometer 351. Calibration for temperature compensation involves generating digital correction factors for various temperatures of interest. Temperature compensation values are determined as described in U.S. patent application Ser. No. 10/675,543, entitled "Calibration of Oscillator Devices," filed Sep. 30, 2003, which application is incorporated herein by reference.

Figure 3:
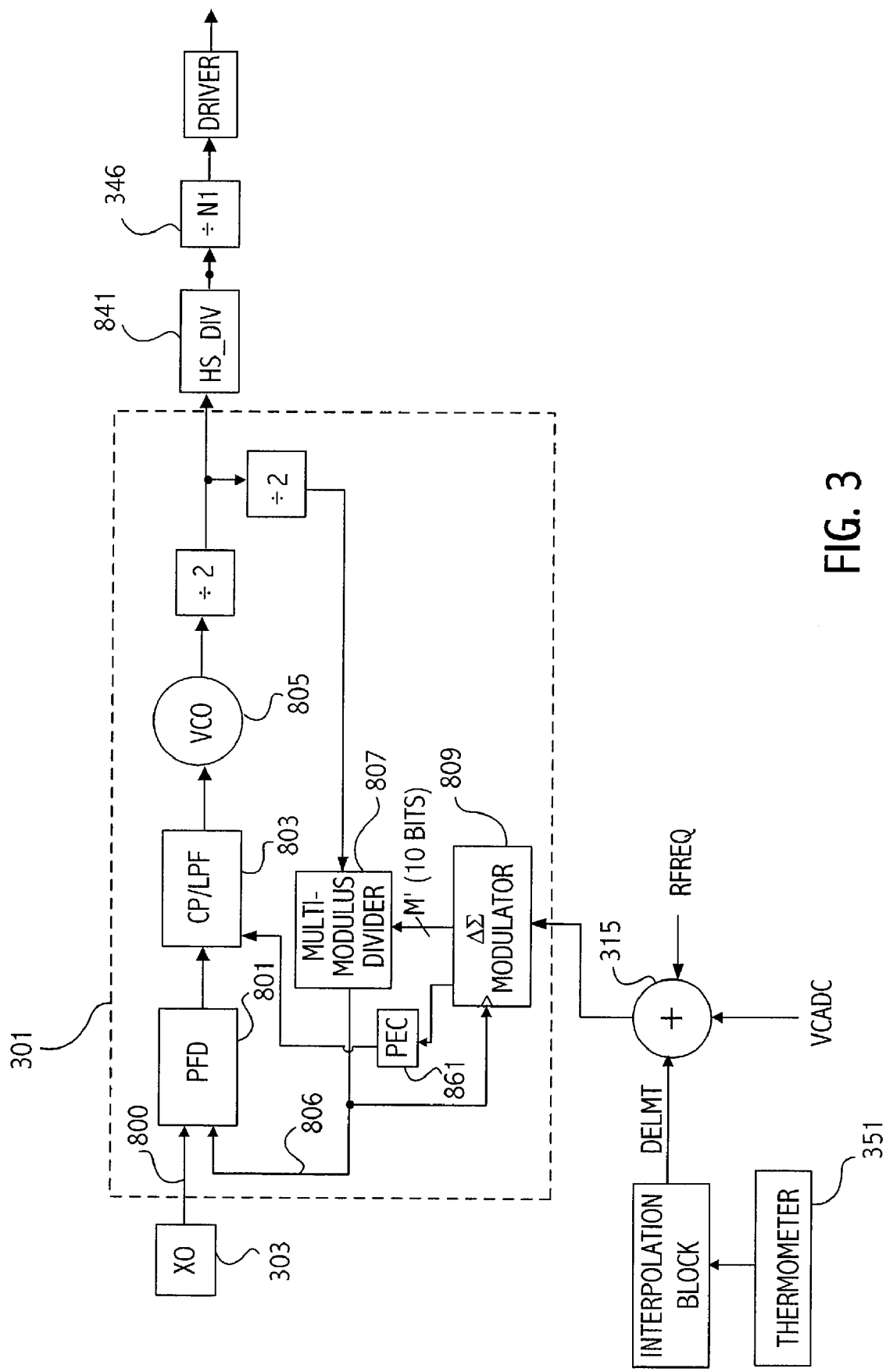
FIG. 3 illustrates an exemplary embodiment of the digitally controlled oscillator of FIG. 2.

Referring to FIG. 3, illustrated is an exemplary embodiment of digitally controlled oscillator (DCO) 301. Crystal (or SAW) oscillator 303 supplies a timing reference to DCO 301 as one input to the phase and frequency detector 801. Phase and frequency detector 801 generates an error term of the difference between the crystal oscillator input and the feedback from VCO 805. Note that the feedback is supplied by multi-modulus divider block 807. Additional details of the operation of multi-modulus divider 807 are described in U.S. Patent Application Publication No. 2004/0232995, entitled "Dual Loop Architecture Useful for a Programmable Clock Source and Clock Multiplier Applications," filed Nov. 25, 2004, which application is incorporated herein by reference. Digitally controlled oscillator 301 is a fractional N loop wherein a period of the reference clock supplied by crystal or SAW 303 may be a non-integer multiple of a period of the oscillator clock signal supplied by VCO 805. Using a fractional N loop allows the use of low cost timing reference such as a low cost crystal oscillator. During normal operation, the DCO receives a control value from summing circuit 315 based on VCADC (from ADC 311 (FIG. 2)), DELMT and RFREQ.

Note that the inner loop forming DCO 301 utilizes a digital loop filter to allow the loop filter to be integrated onto the integrated circuit to reduce potential additional noise sources. Further, as described above, utilization of a digital loop filter allows an accurate implementation of the loop filter that is properly matched to the corners and the order of the noise shaping function and therefore can best reduce the jitter contribution from that source.

In one embodiment, the multi-modulus divider 807 is formed by a series of dividers. Because the feedback frequency may be in the GHz range, a prescalar is used to divide the feedback signal by, e.g., 4 or 5. Subsequent division stages, e.g., a plurality of divide by 4 and/or 5 stages further divide the feedback signal to an appropriate value according to the desired divider value.

Figure 4:
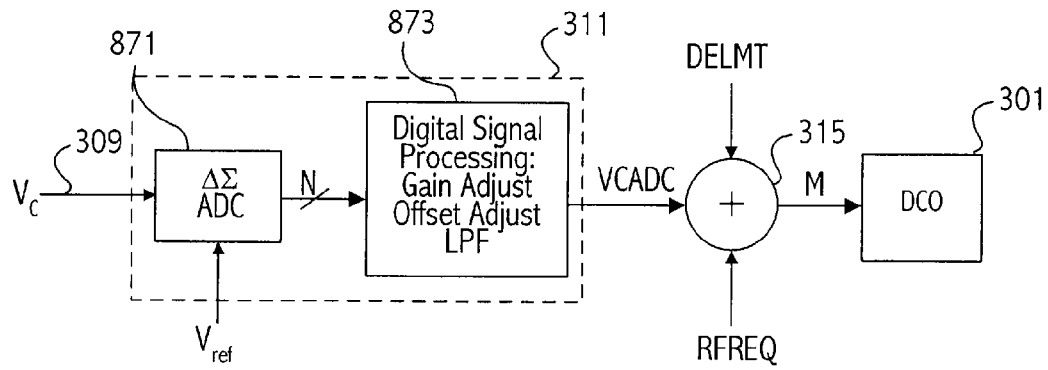
FIG. 4 illustrates additional details of an embodiment of the analog-to-digital conversion shown in FIG. 2.

Referring to FIG. 4, illustrated is a high level block diagram of an embodiment in which a control voltage on voltage control input 309 is utilized to adjust the center frequency of the DCO 301. The center frequency is determined by the reference frequency (RFREQ) as described herein. In an embodiment, the control voltage $V_C$ supplied on 309 is converted in the analog-to-digital converter 311 using a delta sigma analog-to-digital converter (ADC) 871 and digital signal processing block 873. The delta sigma ADC also receives a reference voltage $V_{ref}$ (or reference current depending on the embodiment) utilized in performing the conversion. The output VCADC of circuit 311 is combined with the reference frequency (RFREQ) and temperature compensation signal DELMT (if utilized) and supplied as the control signal M that controls the divide ratio of feedback divider 807 (FIG. 3). Thus, a VCXO function is provided where the output of the DCO is tunable utilizing a control voltage input.

Figure 5:
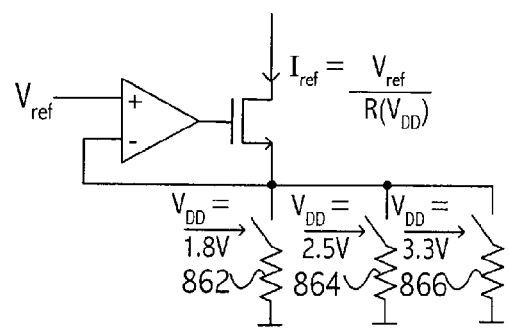
FIG. 5 illustrates a block diagram of switching a resistor according to the supply voltage.

In one embodiment, integrated circuit 300 (FIG. 2) supports multiple supply voltages, e.g., 1.8V, 2.5V, and 3.3V. However, the control voltage $V_C$ is proportional to the supply voltage. If the variation in supply voltage is not accounted for by the analog-to-digital conversion in ADC 871, then the variation in the control voltage $V_C$ based on the supply voltage will result in a significant dynamic range penalty for the lower supply voltages. In order to avoid this penalty, the VCADC digital value can be determined according to $$\frac{A_1 V_C}{A_2 V_{ref}} \cdot Kv,$$

where Kv is a gain factor discussed below and A1 and A2 are scaling factors that are a function of the supply voltage. In an embodiment, with three possible supply voltages, there are three different scaling factors (one for each different supply voltage) to ensure that there is no dynamic range penalty. That can be accomplished by scaling the reference in the analog domain. For example, resistor 862, resistor 864, and resistor 866 may be switched to define a reference current $I_{ref}$ utilized by ADC 871 based on the supply voltage as shown in FIG. 5. In another embodiment of integrated circuit 300, the supply voltage may be switched or capacitors may be switched to achieve the scaling to avoid a dynamic range penalty associated with different supply voltages.

Digital signal processing block 873 can provide multiple digital signal processing functions. For example, by using an A/D to digitize the control voltage, user selectable voltage gain (Kv) settings can be accommodated through mathematical scaling of the A/D output. In one embodiment, a programmable gain adjust value Kv is utilized to scale the output of delta sigma ADC 871. That value is programmable and stored in non-volatile memory 317. Providing a programmable Kv of the DCO allows flexibility in system design. Noise optimizations can be achieved by a proper choice of Kv, as well as scaling of loop filter components. A high Kv means high gain for noise from the voltage control port to output, while a low Kv means lower gain for noise from the $V_C$ port to output. For a similar loop bandwidth, for a higher Kv one would have to use smaller R and larger C to implement the same filter as compared to a lower Kv. Using this technique, Kv settings from, e.g., less than 45 ppm/V to 180 ppm/V can be accommodated allowing for emulation of both low Kv devices like VCXOs and high Kv devices like VCSOs. In addition, support for high frequency operation with low Kv simplifies the design of low loop bandwidth PLLs often required in optical networking equipment. The use of an analog-to-digital converter to digitize the control voltage input results in control voltage tuning linearity that is significantly better than traditional approaches that rely on pulling the resonator.

Figure 6:
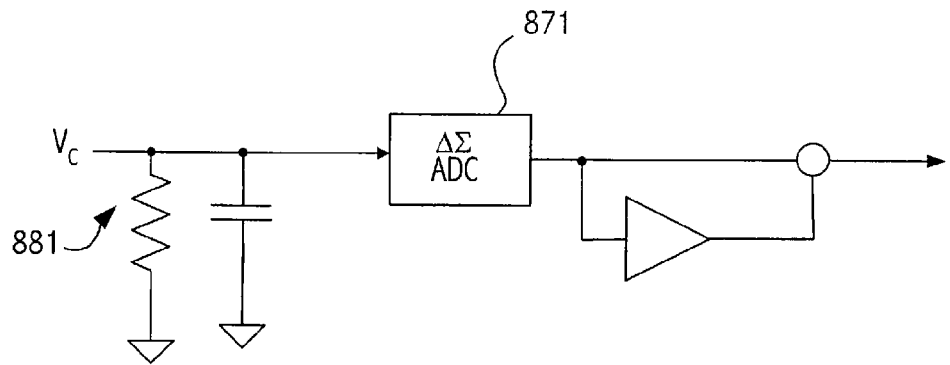
FIG. 6 illustrates conceptually a digital integration path that may be provided by the digital signal processing block of FIG. 4.
Figure 7:
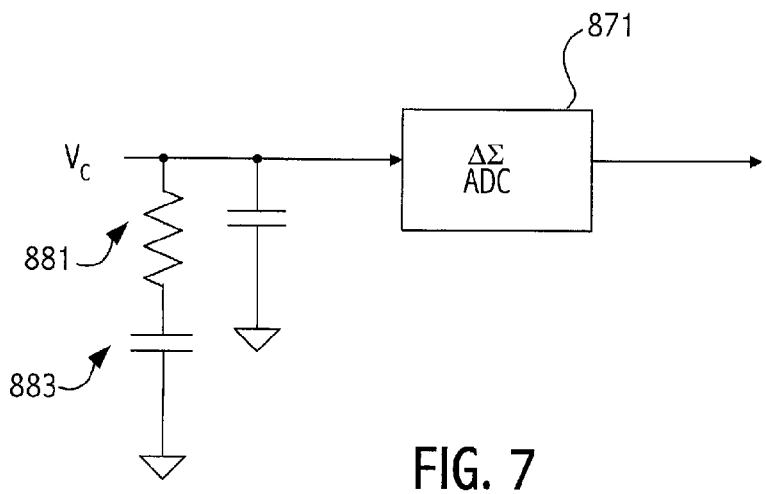
FIG. 7 illustrates a capacitor that may be omitted by using the digital integration path of FIG. 6.

In addition, the digital signal processing block can provide a low pass filter function. Further, an offset adjust value (that may be programmable and stored in non-volatile memory 317) may be utilized to adjust a zero of the analog-to-digital converter using the digital programming block. Further, in one embodiment, the digital signal processing (DSP) block may provide a digital integration path illustrated in a block diagram form in FIG. 6. Integrating in the DSP block allows the function of a large capacitor 883 shown in FIG. 7 that is off-chip to be integrated onto the chip and the large capacitor 883 may therefore be removed from the board.

Referring back to FIG. 3, the use of a delta sigma modulator in a fractional N loop is described. Assume for example, that the value of M is 100 to achieve a desired nominal output frequency from DCO 301 (FIG. 3). The temperature compensation value determined by the interpolation described above may cause the value of M with temperature compensation to be 100.5. The delta sigma modulator in one embodiment provides an output having 8 different integer levels from −3 to 4, to represent the fractional portion, which values are combined with the integer portion (100) and mapped into the dividers of multi-modulus divide by N block 807. Thus, values ranging from 97 to 104 may be applied as divider values to the multi-modulus divide by N block 807. The use of the delta sigma modulator allows appropriate values to be used to average 100.5. Note that a value is generated by the divide block 807 at a rate of the XO (or other reference) clock frequency supplied on node 800.

Note that noise shaping may be used to place any noise generated in the feedback divider in a frequency band that may be subsequently filtered by a low pass filter in loop filter 803. Referring again to FIG. 3, delta sigma modulator 809 supplies a stream of integers that approximates and averages the divide ratio desired. That introduces phase errors that can be compensated by the phase error correction logic 861. A delta sigma modulator receives as the divide control value M=N.f, where N is the integer portion of M and f is the fractional portion. The phase error correction logic 861 generates a phase error correction signal. Additional details on phase error correction can be found in U.S. Patent Application Publication No. 2005/0285685, filed on Jun. 28, 2004, entitled "Phase Error Correction," naming Frey et al. as inventors, which application is incorporated herein by reference.

The approach described herein combines a clock synthesis integrated circuit together with a fixed, low frequency, crystal resonator to realize the functional equivalent of a traditional XO or VCXO but with the ability to operate at multiple user specified frequencies. The multi-frequency operation achieved using the architecture described herein may be used to multiply the output of the fixed frequency oscillator to user defined frequencies between, e.g., 10 MHz and 1.4 GHz with better than 1 ppb accuracy. The crystal resonator used by the on-chip oscillator need not be of high accuracy and does not need to be pullable as all fine frequency tuning may be performed digitally. Specific configurations for multiple frequency operation are stored in the on-chip non-volatile memory (NVM) for later recall via the frequency select control pins.

Note that the integrated circuit described herein may operate off a supply voltage that is internally regulated down to a much lower core voltage. Therefore VCXOs based on this technology will exhibit significantly improved supply noise rejection when compared to traditional implementations. As a result, the task of achieving very good jitter performance in printed circuit card (PCB) environments with noisy ASICs or other large digital ICs is simplified.

As described earlier, embodiments of the invention include a crystal packaged with the integrated circuit. A local bypass capacitor may also be integrated within the package and to further reduce power supply induced jitter. While not shown, a metal lid is seam welded onto the package after suitable backfill with dry nitrogen. Since multiple frequencies can be synthesized from one resonator, package complexity is reduced compared to traditional implementations that require one resonator for each frequency. This enables multi-frequency operation in the same footprint as single frequency XO and VCXO devices.

One advantage of the architecture described herein is that a wide range of low-jitter, high-frequency clock signals can be generated from a single conventional low frequency quartz crystal. That eliminates the need to fabricate unique HFF crystals or SAW resonators for each frequency. Besides the obvious manufacturing issues associated with maintaining a plethora of different resonator frequencies to support a diverse set of customer requirements, HFF crystals and SAW resonators both have reliability and performance issues that can be significantly improved upon through the architecture described herein.

The HFF and SAW based resonators used in the oscillator fabrication process have a frequency that is a function of the minimum device feature. In general, the feature size is inversely proportional to the frequency of oscillation. For example, a SAW resonator requires a line spacing of ~1 micron for operation at 622.08 MHz while a 155.52 MHz resonator requires a line spacing of ~4 microns. As a consequence of these small feature sizes, higher frequency resonators are inherently more susceptible to contamination and stress-related frequency instabilities. Temperature induced mechanical stress also introduces frequency-temperature instabilities which degrade sensitive HFF crystals more than conventional crystal resonators. In contrast, SAW resonators or delay lines are mechanically robust but have residual second order frequency-temperature behavior significantly greater than the much smaller third order frequency-temperature behavior exhibited by conventional quartz crystals.

In contrast, the architecture described herein allows the use of a more inherently stable low frequency quartz crystal resonator. One such a low frequency resonator is approximately 4 times the thickness of a 155.52 MHz fundamental mode crystal and not only exhibits superior frequency stability over temperature, but is also mechanically much more robust. Exemplary low frequency crystal oscillators are crystal oscillators having frequencies of approximately 13 MHz, 19.44 MHz, 26 MHz or 38.88 MHz. Of course other resonators such as SAW resonators and other crystal oscillators could of course be used.

The multi-frequency capability provided by the clock synthesis technology described herein can significantly simplify timing subsystem implementation while improving overall performance and reliability. The advantage is made clear by the exemplary DWDM transponder shown in FIG. 8, which replaces multiple XO and VCXO/VCSO devices with multi-frequency capable devices. Specifically, the DWDM transponder example shown in FIG. 8 replaces an XO bank with a single multiple frequency XO that has a two frequency select inputs to select between 172.64 MHZ, 167.33 MHz, 161.13 MHz and 155.52 MHz. Of course, because there is a continuous range of frequencies selectable, in one embodiment, between 10 MHz and 1417.5 MHz, those particular frequencies are exemplary but particularly useful in the DWDM transponder illustrated. Thus, four oscillators with four crystals have been replaced in that portion of the line card with one device 1501. The frequency select signals 1503 select which frequency should be output as described earlier herein.

Further the receive path scaling PLL 1505 includes only a signal VCXO 1509. The output of the phase detector/loop filter 1511 drives the voltage control input 1513 (an exemplary embodiment of which is described in more detail with reference to FIG. 4). Due to drift, aging, temperature changes, and/or other effects affecting the crystal oscillator in VCXO 1509, control voltage 1513 is adjusted to maintain the output frequency of the VCXO at the target frequency. The frequency select signals 1515 may be controlled by the same source as frequency select signals 1503. That source may be a microprocessor, microcontroller, field programmable gate array (FPGA), or other intelligent controller device. In other embodiments, the frequency select terminals may instead simply be tied to select a particular value. In still other embodiments, the microprocessor, microcontroller, ASIC, or other intelligent controller may control a digital interface on XO 1501 and VCXO 1509 and supply an indication of the desired frequency as described previously over the digital interface. For example, the intelligent controller may write a register to select one of four frequencies. In the embodiment illustrated in FIG. 8, the VCXO can be selected to provide one of four frequencies at 690.57 MHz, 669.34 MHz, 644.53 MHz or 622.08 MHz. In other embodiments, other frequencies are available. Similarly, transmit side 1507 has a similarly reduced device count. Instead of four devices with four resonators providing four frequencies, a single device 1517 with one crystal can be used to supply a selected one of four frequencies based on the frequency select signals (or based on programming via a digital interface).

Figure 8:
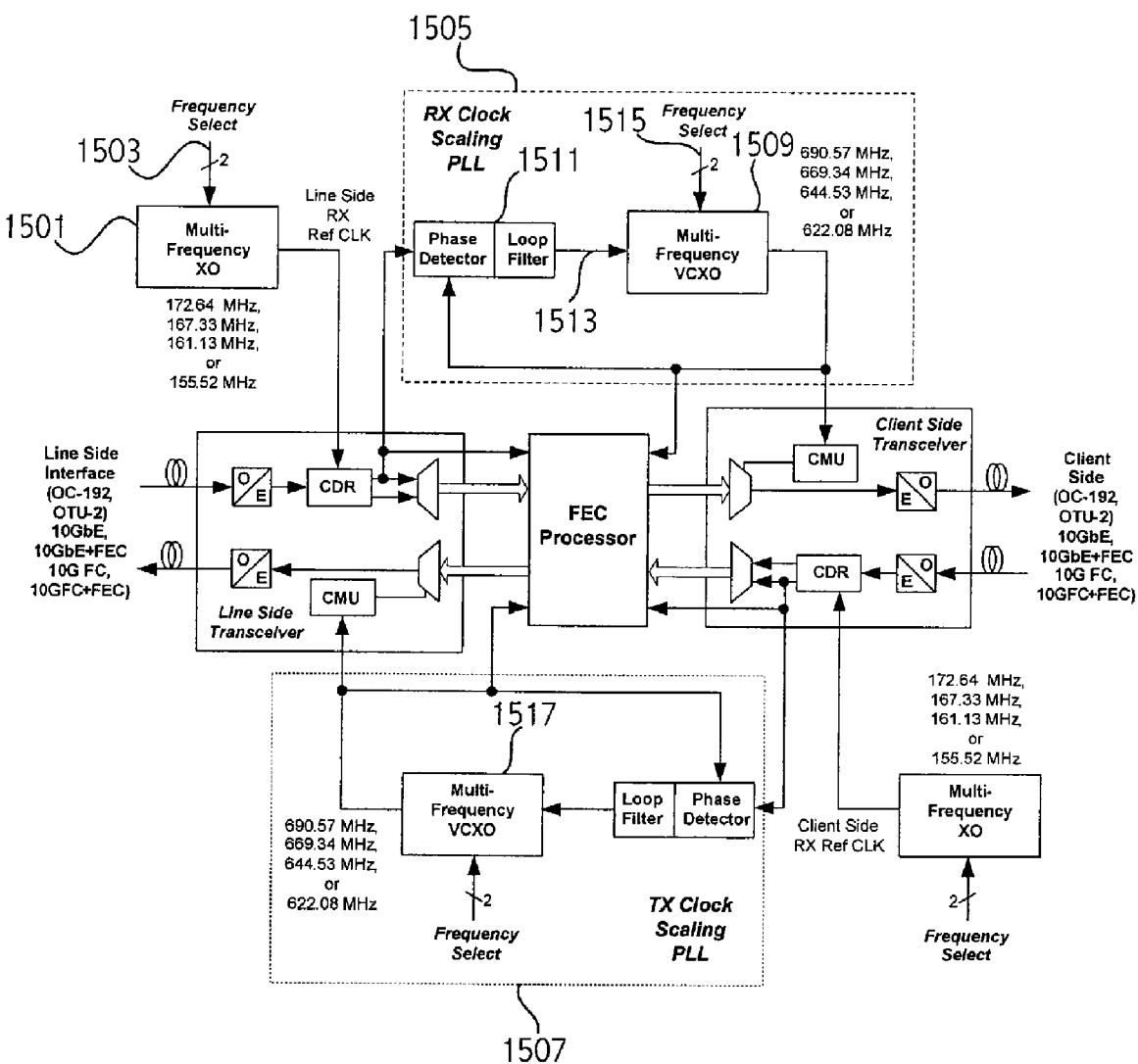
FIG. 8 illustrates a Dense Wavelength Division Multiplexing (DWDM) transponder according to an embodiment of the invention.
Figure 9:
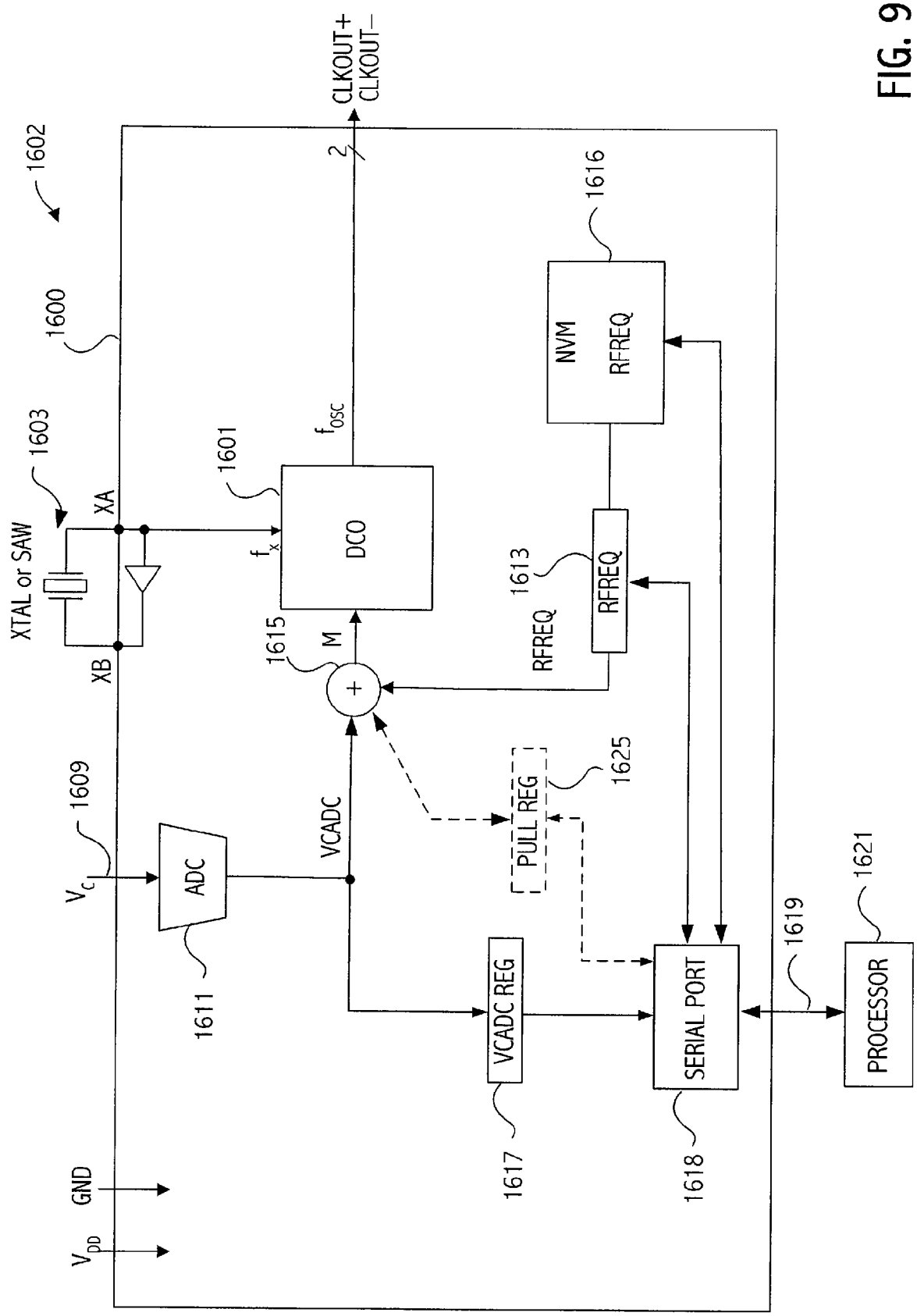
FIG. 9 illustrates an exemplary embodiment of a timing subsystem providing expanded pull range utilizing an off-chip processor.

Referring to FIG. 9, illustrated is a simplified block diagram of integrated circuit 1600 (similar to integrated circuit 300 in FIG. 2 but omitting some of the detail) and crystal oscillator 1603. Integrated circuit 1600 and crystal oscillator (or SAW) 1603 function as a voltage controlled crystal oscillator (VCXO) device 1602. As described above, the integrated circuit 1600 and crystal oscillator 1603 may be packaged in a single package. FIG. 9 illustrates an embodiment of a VCXO 1602 providing enhanced pull range capabilities. Such a VCXO may be used as VCXO 1509 in FIG. 9. As a result of aging, temperature, or other effects on the crystal (other effects include power supply pushing, package stress, barometric pressure, shock, and G force sensitivity) and other components within the system, the output frequency of DCO 1601 can vary from a target output frequency. Digitally controlled oscillator 1601 may be implemented as described, e.g., in association with FIG. 3. When the output of DCO 1601 moves off of its desired frequency, voltage control input 1609 (1513 in FIG. 8) is adjusted up or down to "pull" VCXO 1602 back to its target frequency output. As referred to herein "actual pull range" is a range of oscillator output signal frequencies associated with a particular reference frequency control value for which the control voltage input (e.g., $V_C$ supplied on 1609 of FIG. 9 and $V_C$ supplied on 1513 in FIG. 8) can pull the frequency of the oscillator output signal (e.g., the frequency of the output of VCXO 1602) to a target frequency. How $V_C$ affects the VCXO output is determined in part by how the ADC 1611 converts control voltage $V_C$ to a digital value and affects the VCXO output. If a large gain factor (Kv) is associated with ADC 1611, any noise present on the control voltage signal or caused by the A/D conversion can be amplified and supplied as a control value to the DCO resulting in undesirable effects on the output frequency of the DCO. If a smaller Kv is used, that may limit the actual pull range available. However, a smaller Kv may be advantageous because the feedback loop in which the VCXO is placed can use a smaller capacitor in loop filter in 1511 of FIG. 8.

Referring again to FIG. 9, assume that the ADC 1611 is configured so that changes in $V_C$ can cause changes of e.g., several hundred parts per million in the output of the VCXO, i.e., the actual pull range of VCXO 1602 is several hundred parts per million. In an embodiment of VCXO 1602, the pull range available for a given gain can be determined by multiplying the gain (e.g., assume that the $V_C$ input can adjust the output of the DCO by 240 ppm/V) times 80% of the supply voltage. Assume the supply voltage is 3.3V, the pull range=0.8×3.3×240=634 ppm or ±317 ppm from the VCADC set point, which is the input voltage at which the ADC produces its mid-scale (digital "0") output. If the factor(s) (e.g., temperature or age) influencing the variation in the DCO output cause the output to approach the maximum of the actual pull range in one direction, e.g., 317 ppm, and if the DCO output cannot be corrected, then the part no longer meets requirements.

Accordingly, the ability to provide an effective pull range that is greater than the actual pull range of a controllable oscillator circuit enhances the ability to correct for temperature, aging or other factors that affect the output frequency of the DCO over time. As referred to herein, an "effective pull range" is a range of frequencies for which the frequency of the output of VCXO 1602 may be pulled to a target frequency. In at least one embodiment VCXO 1602, the effective pull range of VCXO 1602 is increased from the actual pull range of VCXO 1602 by including adjustment capabilities for increasing or decreasing the control value being supplied to the DCO from a source other than the $V_c$ terminal.

As described above, the control value M supplied to the DCO 1601 is a digital word used to adjust the value of a feedback divider. The value of M may be determined based on an arithmetic combination of several different sources. One source for the digital control value M supplied to the DCO is from the reference frequency value (RFREQ) stored in the non volatile memory (NVM) 1616. In at least one embodiment of VCXO 1602, the value stored in NVM 1616 is loaded into register 1613 and the contents of the register 1613 are supplied to arithmetic circuit 1615 (e.g., an adder, multiplier, or other suitable circuit), which combines the RFREQ value with the control voltage VCADC to generate the value M. In at least one embodiment of VCXO 1602, RFREQ register 1613 can be written via serial port 1618. The serial port may be the same serial port described above. In addition, the value generated by ADC 1611 is supplied to VCADC register 1617, which can be read by the serial port. Register 1617 may be internal to the ADC 1611 and not a separate register. Note that there is no need that the port be serial, but a serial port may be preferred because the environment is typically pin constrained having relatively slow communication requirements warranting use of a serial communication path.

In at least one embodiment of VCXO 1602, by reading the VCADC register via serial port 1618, processor 1621 can determine whether the value of $V_C$ is close to the limit of the actual pull range of the voltage control input by comparing the VCADC value to a threshold. If the VCADC value is approaching the limit of the actual pull range, processor 1621 can adjust the reference frequency control value by writing RFREQ register 1613 (or pull register 1625) with a new value, which allows ideally for the $V_C$ voltage to return to a midscale value, thereby dynamically recentering the output frequency of VCXO 1602 within the actual pull range without modifying the voltage gain (Kv) of ADC 1611, thereby maintaining a low tuning slope and the particular noise performance of the voltage control port to output.

For example, assume that aging and/or temperature effects have reduced the output frequency of VCXO 1602. Assume that the value of M (i.e., the digital control value supplied to the DCO 1601) is at a value that causes the loop, of which the VCXO 1509 is a part (see FIG. 8), to detect that drop and increase $V_C$ in order to compensate for the drop in frequency. As $V_C$ increases, the output frequency of DCO 1601 increases. However, if the output frequency of the VCXO continues to drop, $V_C$ continues to increase until it approaches its maximum value (i.e., the limit of the actual pull range) after which it could no longer correct for continued drops in VCXO frequency. The approach to the maximum $V_C$ value will be reflected in the VCADC register. Processor 1621 detects the approach to the maximum value and increases the reference frequency control value, e.g., by writing a larger value in RFREQ register 1613. That allows the $V_C$ voltage to drop since the DCO output frequency increases independently from changes in control voltage $V_C$. Thus, the same initial pull range has become available again and the effective pull range of VCXO 1602 has been made continuous across the entire frequency range of operation for VCXO 1602 because the processor can adjust the value of M by adjusting the reference frequency, e.g., by writing an appropriate value in RFREQ register 1613.

Note that while in at least one embodiment of VCXO 1602 the RFREQ register can be written to change the reference frequency, in other embodiments, pull register 1625 is provided that can be used to provide the same function (e.g., by writing a value that is used to increase or decrease the value of the RFREQ register). Thus, if the frequency output of the DCO is approaching the limit of the pull range, pull register 1625 can be written (higher or lower) to adjust the DCO output frequency without relying on control voltage $V_C$ to accomplish the adjustment. If a pull register is present, but no adjustment to the value of the RFREQ register is necessary, the pull register contains a value that will not affect the reference frequency. As described herein, any reference to writing a pull register to adjust the pull range associated with the reference frequency control value also applies to writing an RFREQ register and vice versa.

In at least one embodiment of VCXO 1602, processor 1621 can compare VCADC register 1617 to threshold value(s) and can adjust M through the RFREQ 1613 (or pull register 1625). In other embodiments, processor 1621 may implement a digital integrator to average the VCADC values. If an average of VCADC indicates that the VCADC value is higher than a threshold value (e.g., higher than the midscale value, indicating that the output frequency of the DCO was dropping and corrected by increasing $V_C$), then the reference frequency control value should be increased (e.g., by writing the RFREQ register or the pull register). If the average indicates that VCADC is below a threshold value (indicating the output frequency of the DCO was increasing and corrected by lowering $V_C$), the reference frequency control value should be decreased (e.g., by writing the RFREQ register or the pull register) to decrease M and allow $V_C$ to rise back to its midscale value.

In at least one embodiment of VCXO 1602, processor 1621 performs fine-frequency adjustments by reading VCADC register 1617, RFREQ register 1613, and/or pull register 1625 via serial port 1618. Processor 1621 adjusts the reference frequency control value to reduce the difference between VCADC and a nominal control voltage (e.g., approximately ⅜ VDD). Processor 1621 writes RFREQ 1613 (and/or pull register 1625) via serial port 1618 with an adjusted value. For example, the adjusted value may be the current value of RFREQ increased or decreased by a small amount (e.g., 1 ppm) in the direction that reduces the difference between VCADC and the nominal control voltage. Since both VCADC and RFREQ are proportional to the output frequency of DCO 1601, RFREQ is adjusted in the same direction indicated by VCADC (i.e., if VCADC is positive, then RFREQ is increased and if VCADC is negative, then RFREQ is decreased).

In at least one embodiment of the invention, the VCADC register includes separately accessible registers, which may be written simultaneously, but not read simultaneously. Accordingly, the adjustment procedure may be applied first using the most-significant bits of VCADC, followed by application using the least-significant bits of VCADC. In at least one situation, adjustments are performed using only the most-significant bits of VCADC.

In at least one embodiment of VCXO 1602, RFREQ register 1613 contains a binary representation of the reference frequency multiplier that is 38 bits wide including an integer portion (e.g., 10 most-significant bits) and a fractional portion (e.g., 28 least-significant bits). Processor 1621 converts the integer portion directly form a decimal value to a binary value. The fractional portion is converted into an integer by multiplying by $2^{28}$ and then truncating (or rounding). The truncated value is then converted to a binary value. Processor 1621 may only be able to write 8-bits of the RFREQ register 1613 at a time. Since VCXO 1602 responds immediately to changes in the RFREQ value, when increasing RFREQ, changes to the most-significant bits are written first followed by writes to bits of less significance, in order of decreasing significance. When decreasing RFREQ, the least-significant bits are written first, followed by writes to more-significant bits in order if increasing significance. Accordingly, the reference frequency control value changes monotonically until the write of the RFREQ value is completed for a particular adjustment.

Note that the rate of adjustment of the reference frequency control value (e.g., the value of RFREQ and/or the pull register) and more generally of M, to increase the effective pull range of VCXO 1602 should be lower than the PLL loop filter zero. For example, the loop bandwidth may be 100 Hz to 1 KHz and the loop filter zero approximately $\frac{1}{100}^{th}$ of the loop bandwidth. The update rate of reference frequency control value should typically be $\frac{1}{10}^{th}$ or $\frac{1}{100}^{th}$ of the PLL loop filter zero. Thus, the rate of adjustment may be slower than once per second. The exact rate depends on the parameters associated with the particular PLL. Note that the amount that the reference frequency control value is adjusted at any one time may vary based on the system requirements and the ability of the loop to filter out the results of the change to the reference frequency control value. For example, the reference frequency control value may be adjusted by one part per million until the desired amount of change has occurred to M to widen the effective pull range available through $V_C$. In some systems the amount of adjustment may be greater or less than one part per million.

In at least one embodiment of the invention, the rate of adjustment (i.e., the time constant of the loop-filter) is determined in-system automatically by varying the reference frequency control value (RFREQ) and determining how long it takes for the control voltage VCADC to stabilize. For example, the reference frequency control value is changed by 20 ppm. In response, the control voltage VCADC is adjusted (e.g., by phase detector/loop filter 1511 of FIG. 8) to provide a target frequency of the output of the DCO. The amount of time it takes for VCADC to settle and for the output of the DCO to achieve the target frequency can be used to determine how quickly the reference frequency control value may be changed in operation.

In some embodiments, the update does not have to be periodic, for example once per second. In fact, the adjustment to the M value may be made only once. A crystal oscillator tends to age more significantly during its first two years. Thus, the adjustment to reference frequency control value (i.e., M) through the RFREQ register and/or the pull register can be made only once at approximately the two year time frame to account for a significant portion of aging effects of the crystal and satisfactorily extend the pull range through the product's expected lifecycle. Thus, depending on system capabilities and needs, the update can occur regularly (every couple of seconds) or irregularly (once at two years) or at an appropriate time frame according to needs of the system.

Figure 10:
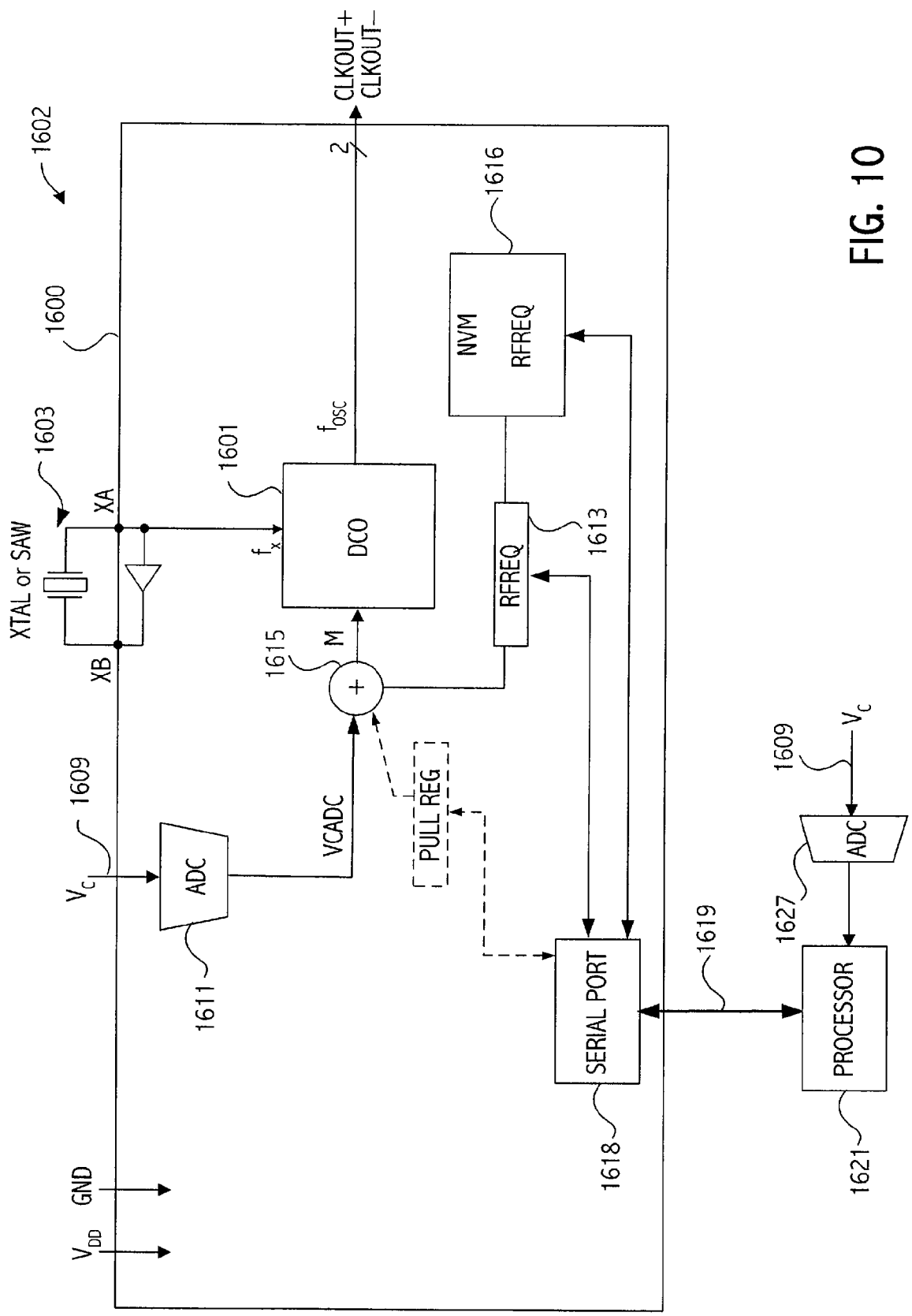
FIG. 10 illustrates an exemplary embodiment of a timing subsystem providing expanded pull range utilizing an off-chip analog-to-digital converter.

Referring to FIG. 10, in some embodiments of VCXO 1602, rather than reading the VCADC register to determine the control voltage $V_C$, the $V_C$ value can be converted to a digital voltage through an off-chip ADC (e.g., ADC 1627 off-chip from integrated circuit 1600), which is coupled to receive control voltage 1609, and the value determined by ADC 1627 can be used by the processor to adjust the reference frequency control value.

Figure 11:
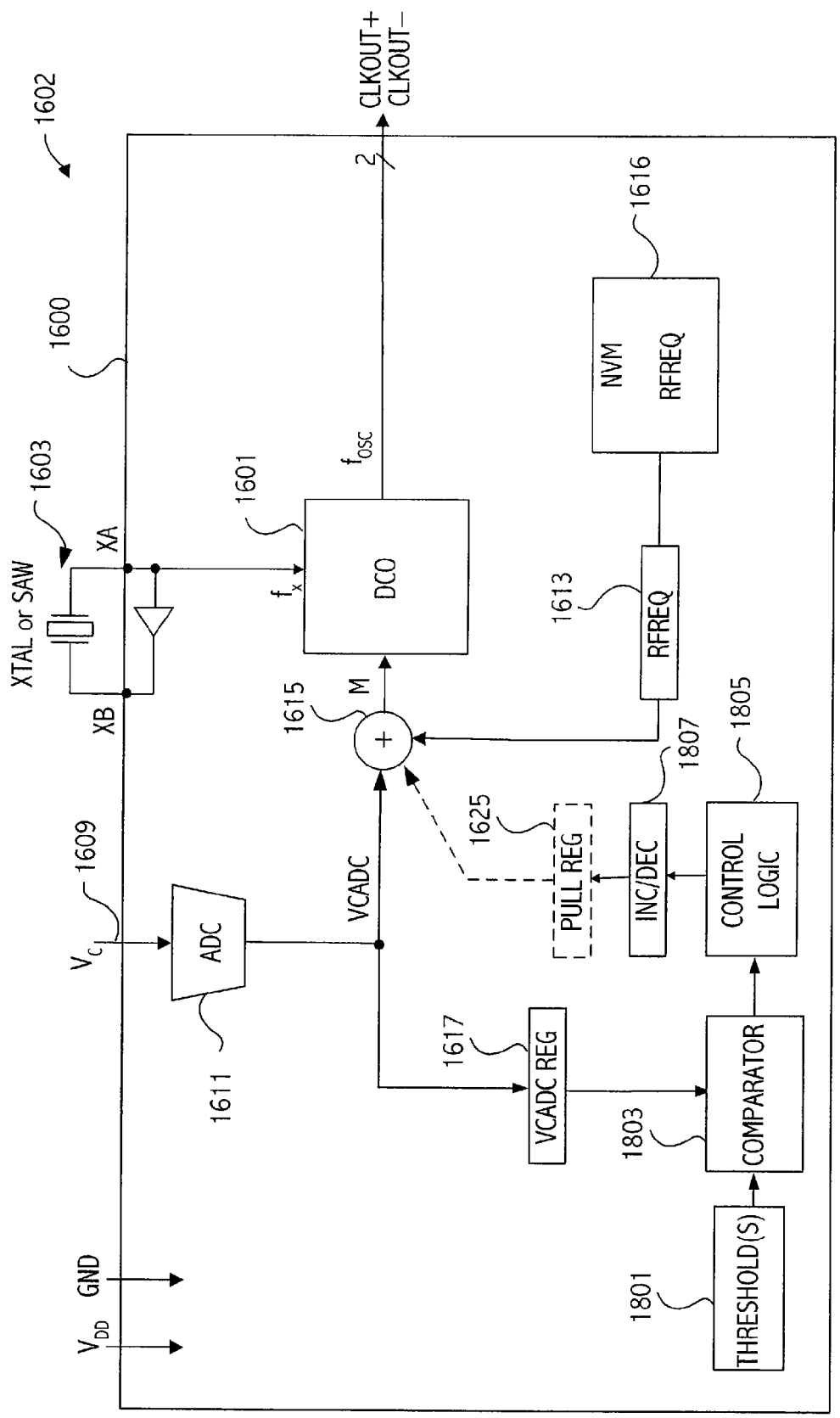
FIG. 11 illustrates an exemplary embodiment of a timing subsystem providing expanded pull range utilizing on chip-circuitry to compare the digital representation of the control voltage to one or more threshold values and to adjust a digital control word supplied to a digitally controlled oscillator based on the comparison.

In at least one embodiment of VCXO 1602, the adjustment capability may be included on the integrated circuit 1600 as shown in FIG. 11. Instead of comparing the VCADC value off chip, the value is compared with threshold values 1801 by comparator 1803. The result of that comparison is supplied to control logic 1805, which may be a simple state machine. Control logic 1805 increases or decreases the contents of pull register 1625, e.g., using incrementer/decrementer 1807 or other appropriate circuitry, according to the comparison. The adjustment operations may run continuously to maintain $V_C$ near its midscale value. In such a case threshold value 1801 may be the midscale value of VCADC and any deviation from that value results in appropriate adjustments to the reference frequency control value. In typical systems, hysteresis may be implemented to ensure that the incrementing or decrementing of the pull register does not occur too frequently. Similar to the description above, the rate of change of the reference frequency control value should be below the PLL loop filter zero and the amount of change once a change is desired will depend on system requirements. A typical system may change the pull register by one part per million. In other embodiments, rather than adjusting continuously, the pull register is not adjusted until a high or low threshold has been crossed. The continuous change approach may be implemented with the systems shown in FIG. 9 or 10 as well.

Figure 12:
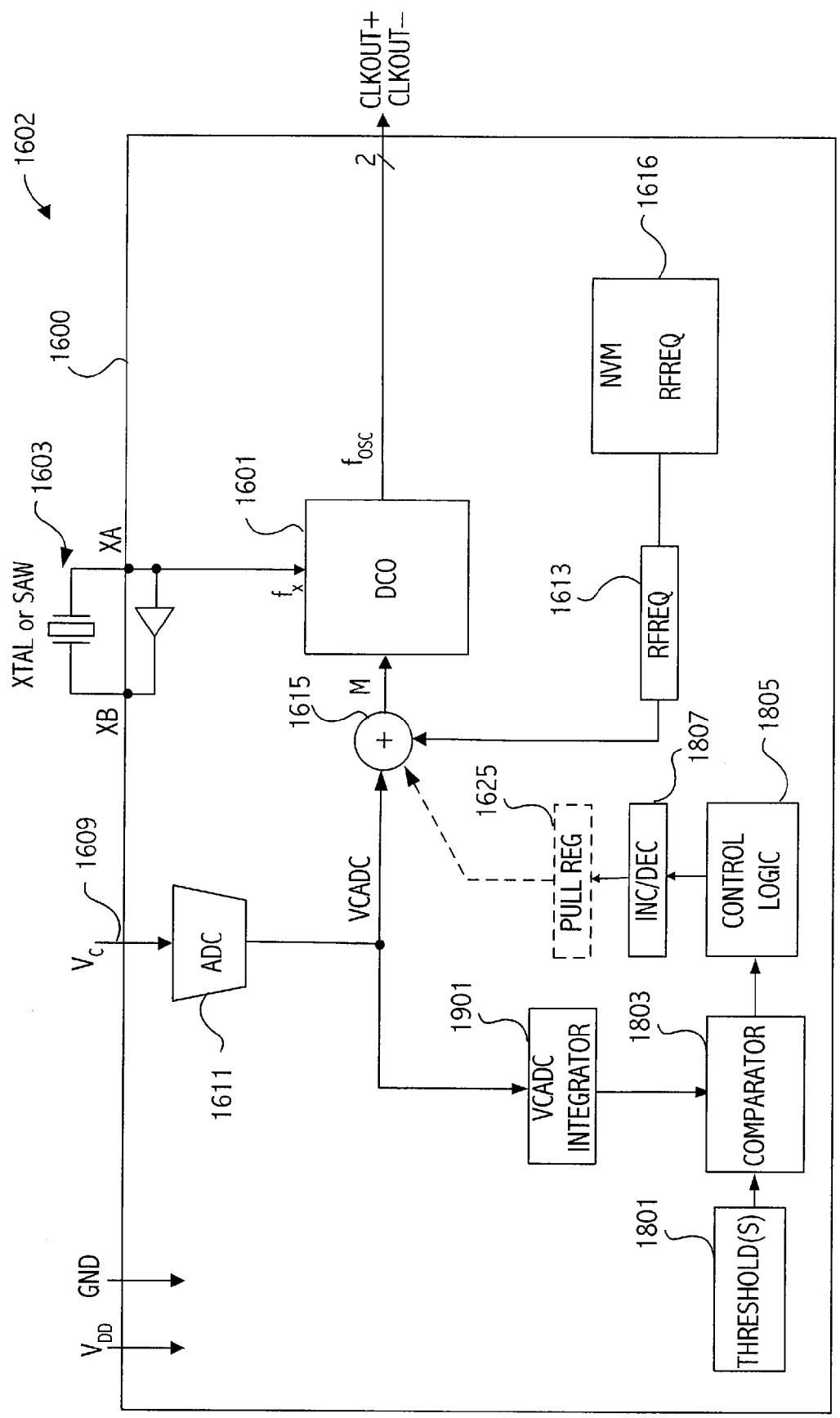
FIG. 12 illustrates an exemplary embodiment of a timing subsystem providing expanded pull range utilizing on chip-circuitry to compare an integrated value of the digital representation of the control voltage to one or more threshold values and to adjust the digital control word supplied to the digitally controlled oscillator based on the comparison.

In at least one embodiment of VCXO 1602, rather than compare the current VCADC value to thresholds, a digital integrator may be utilized as shown in FIG. 12. VCADC integrator 1901 integrates the VCADC value to provide an average value of VCADC. The integrated value is compared to appropriate ones of threshold(s) 1801 and control logic 1805 adjusts the pull register 1625, accordingly.

In order to account for power-on anomalies that occur when power is first applied to the system, the effective pull range may be limited to 0.5% or 1% of the output to limit the chance of adverse impact on initial lock of DCO 1601. In another embodiment, the effective pull range may be limited to, e.g., 1000 parts per million. In other embodiments, the circuitry associated with the enhanced pull range may be enabled a suitable amount of time after power on, e.g., a predetermined amount of time after lock has been achieved. Systems may provide a similar limitation on the use of the circuitry associated with the enhanced pull range during loss of lock conditions.

Figure 13:
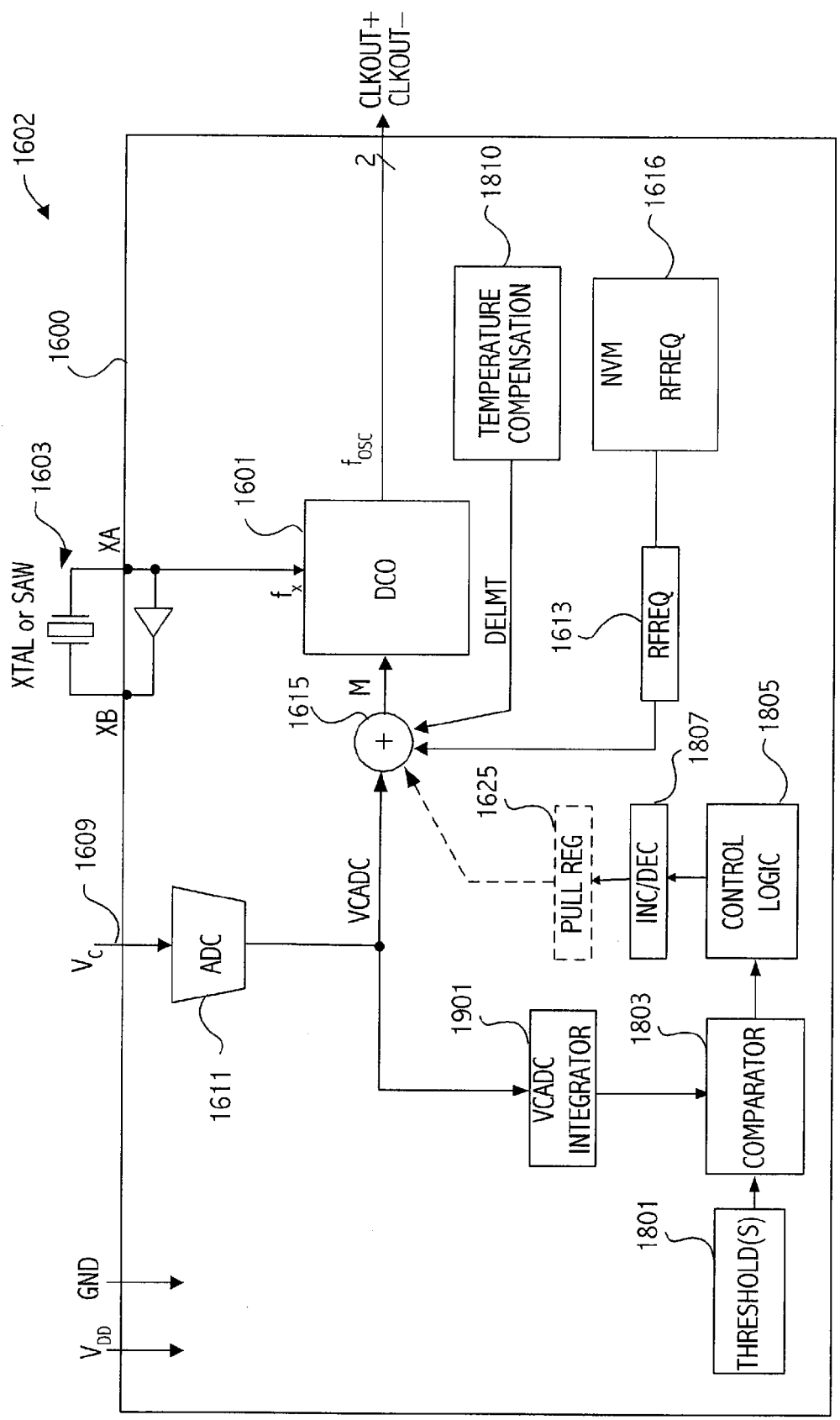
FIG. 13 illustrates an exemplary embodiment of a timing subsystem providing expanded pull range and temperature compensation.

Referring to FIG. 13, in at least one embodiment of VCXO 1602, temperature compensation circuit 1810, which may include a thermometer circuit, determines values as described in U.S. Patent Application Publication No. 2004/0222856, entitled "Calibration of Oscillator Devices," filed Sep. 30, 2003, which application is incorporated herein by reference. The value DELMT is combined with adjustments based on the VCADC value(s) to adjust the reference frequency control value, e.g., by summer 1615, a multiplier, or other suitable technique. If temperature compensation is not used, a value for DELMT is selected so as to not affect the output of DCO 301.

An advantage of the architecture described herein is a reduced cost of the capacitor(s) in loop filter 1511 of FIG. 8 since VCXO 1509 can provide a larger effective pull range corresponding to a smaller value of Kv than provided by a typical phase-locked loop implementation. The smaller Kv value allows a smaller capacitance to be used in loop filter 1511. In general, choosing small capacitors will decrease the size of a phase-locked loop implementation. In typical loop equations for a phase-locked loop, the loop bandwidth is proportional to resistance and Kv. However, the loop-filter zero is proportional to 1/RC. A design including a low bandwidth loop-filter zero typically includes large resistances or large capacitances. In some phase-locked loop designs, the ratio of the loop-filter zero to the loop bandwidth is maintained at 1/100. To achieve this ratio, designers trade off board space, design margin (e.g., temperature stability), and loop dynamics (e.g., loop bandwidth vs. loop-filter zero).

By reducing the value of Kv for a particular pull range, the resistance may be increased to achieve a particular loop bandwidth. If the resistance is increased, the value of the capacitance to achieve a particular loop-filter zero can be decreased. The reduced capacitance value may allow use of capacitor(s) that have increased temperature stability, which may not be available for implementations requiring a greater capacitance value. In at least one embodiment of the invention, loop filter 1511 includes ceramic surface mount capacitor(s). A ceramic surface mount capacitor is formed from a particular dielectric material which provides a capacitance having increased temperature stability and reliability but a smaller footprint as compared to capacitances provided by other types of capacitors, which are formed from other types of dielectric materials.

Thus, various embodiments have been described for implementing enhanced pull range. The description of the invention set forth herein is illustrative, and is not intended to limit the scope of the invention as set forth in the following claims. Other variations and modifications of the embodiments disclosed herein, may be made based on the description set forth herein, without departing from the scope of the invention.

What is claimed is:

1. An apparatus comprising:
   a controllable oscillator circuit configured to provide an oscillator output signal, a frequency of the oscillator output signal being based at least in part on a first digital control signal and a timing reference signal;
   a voltage control input configured to adjust the frequency of the oscillator output signal around a frequency determined by a reference control value; and
   wherein the first digital control signal is based on at least a control voltage present on the voltage control input and the reference control value, the reference control value being based on at least a stored control value and one or more control voltages present on the voltage control input.

2. The apparatus, as recited in claim 1, wherein the controllable oscillator circuit has at least one continuous frequency range of operation and the controllable oscillator circuit has an effective pull range that is continuous across the at least one continuous frequency range of operation.

3. The apparatus, as recited in claim 1, further comprising:
   circuitry for dynamically adjusting the reference control value to a value corresponding to a frequency of the oscillator output approximately centered within an actual pull range associated with the controllable oscillator circuit and the voltage control input, the adjusting being based on the one or more voltages present on the voltage control input.

4. The apparatus, as recited in claim 3, wherein an integrated circuit includes the controllable oscillator circuit and the circuitry for dynamically adjusting the reference control value.

5. The apparatus, as recited in claim 3, wherein an integrated circuit includes the controllable oscillator circuit and at least a portion of the circuitry for dynamically adjusting the reference control value is external to the integrated circuit.

6. The apparatus, as recited in claim 3, wherein the actual pull range of the controllable oscillator circuit is a range of oscillator output signal frequencies associated with a particular reference frequency control value for which the control voltage input can pull the frequency of the oscillator output signal to a target frequency.

7. The apparatus, as recited in claim 1, wherein the reference control value is based further on at least one control voltage threshold value.

8. The apparatus, as recited in claim 1, further comprising:
   an integrator circuit for providing an average value of the one or more control voltages present on voltage control input, the average value utilized in determining the reference control value.

9. The apparatus, as recited in claim 1, further comprising:
   a conversion circuit to convert the control voltage present on the voltage control input to a digital signal utilized in determining the reference control value.

10. The apparatus, as recited in claim 9, wherein an integrated circuit includes the controllable oscillator circuit and the conversion circuit is included on the integrated circuit.

11. The apparatus, as recited in claim 9, wherein an integrated circuit includes the controllable oscillator circuit and the conversion circuit is external to the integrated circuit.

12. The apparatus, as recited in claim 1, further comprising:
   a serial port for coupling to control circuitry for determining the reference control value.

13. The apparatus as recited in claim 1, further comprising a temperature compensation circuit coupled to supply an adjustment value according to a detected temperature, and wherein the first digital control signal is adjusted according to the adjustment value.

14. The apparatus, as recited in claim 1, wherein the controllable oscillator circuit includes a fractional N phase-locked loop (PLL) and the first digital control signal is coupled to determine a divide ratio of a feedback divider circuit of the fractional N PLL.

15. The apparatus, as recited in claim 1, wherein the controllable oscillator circuit forms a portion of a phase-locked loop (PLL).

16. A method comprising:
supplying a digital control signal to a controllable oscillator thereby determining a frequency of an oscillator output signal; and
determining the digital control signal based on at least a reference control value and a control voltage for adjusting the frequency of the oscillator output signal around a frequency determined by the reference control value; and
adjusting the reference control value based on at least one value of the control voltage.

17. The method, as recited in claim 16, wherein the controllable oscillator has at least one continuous frequency range of operation and the controllable oscillator has an effective pull range that is continuous across the at least one continuous frequency range of operation.

18. The method, as recited in claim 16, wherein the adjusting substantially centers the frequency of the oscillator output signal within an actual pull range associated with the controllable oscillator and the voltage control input.

19. The method, as recited in claim 16, wherein the control voltage approaches an associated midscale value after the adjusting.

20. The method, as recited in claim 16, further comprising:
controlling a divide ratio of a feedback divider circuit of the controllable oscillator.

21. The method, as recited in claim 16, wherein the reference control value is adjusted based on an average of the control voltage.

22. The method, as recited in claim 16, wherein the adjusting is based on the at least one control voltage and at least one threshold voltage level.

23. The method, as recited in claim 16, wherein the adjusting is periodic, a period of the adjusting being less than a loop filter zero of the controllable oscillator.

24. The method, as recited in claim 16, further comprising:
determining a limit on a period of the adjusting.

25. The method, as recited in claim 16, wherein the adjusting is performed at least once after substantial system aging has occurred.

26. The method as recited in claim 16 further comprising:
adjusting the digital control signal based at least in part on a detected temperature.

27. An apparatus comprising:
means for generating an oscillator output signal based on at least a timing reference signal and a reference control value;
means for adjusting a frequency of the oscillator output signal around a frequency determined by the reference control value; and
means for centering the frequency of the oscillator output within a pull range associated with the means for adjusting and the means for generating.

* * * * *